United States Patent
Deeley et al.

(10) Patent No.: US 6,587,058 B1
(45) Date of Patent: Jul. 1, 2003

(54) PROCESSING CIRCUIT AND METHOD FOR VARIABLE-LENGTH CODING AND DECODING

(75) Inventors: Richard M. Deeley, San Jose, CA (US); Yatin Mundkur, Los Altos Hills, CA (US); Woobin Lee, Lynnwood, WA (US)

(73) Assignee: Equator Technologies, Inc., Seattle, WA (US)

(*) Notice: Subject to any disclaimer, the term of this patent is extended or adjusted under 35 U.S.C. 154(b) by 0 days.

(21) Appl. No.: 10/280,975

(22) Filed: Oct. 25, 2002

Related U.S. Application Data

(63) Continuation of application No. 09/750,383, filed on Dec. 21, 2000, now Pat. No. 6,507,293, which is a continuation-in-part of application No. PCT/US99/14560, filed on Jun. 24, 1999.
(60) Provisional application No. 60/090,648, filed on Jun. 25, 1998.

(51) Int. Cl.[7] .............................................. H03M 7/40
(52) U.S. Cl. ....................................... 341/67; 341/65
(58) Field of Search ....................................... 341/65, 67

(56) References Cited

U.S. PATENT DOCUMENTS

| | | |
|---|---|---|
| 5,638,531 A | 6/1997 | Crump et al. |
| 5,821,887 A | 10/1998 | Zhu |
| 5,831,557 A | 11/1998 | Handley |
| 5,857,088 A | 1/1999 | Keith et al. |

OTHER PUBLICATIONS

Berekovic et al., *A Multimedia RISC Core for Efficient Bitstream Parsing and VLD,* Proceedings of SPIE Multimedia Hardware Architectures 1998, vol. 3311 Jan. 1998, San Jose, Ca., pp. 131–142.*

Iwata et al., ISSCC '97 "A 2.2GOPS Video DSP with 2–RISC MIMD, 6–PE SIMD Architecture for Real–Time MPEG2 Video Coding/Decoding", IEEE 1997 International Solid State Circuits Conference Tech. Papers, pp. 258, 259 & 469.

Yamada et al., "Real–Time MPEG Encoding and Decoding with a Dual–Issue RISC Processor", IEEE 1997 Custom Integrated Circuits Conference, pp. 225–228.

* cited by examiner

*Primary Examiner*—Howard L. Williams
(74) *Attorney, Agent, or Firm*—Graybeal Jackson Haley LLP

(57) ABSTRACT

A variable-length encode/decode processor includes a central processing unit and an instruction buffer and a getbits processing engine coupled to the central processing unit. Such a processor can be used to encode data as variable-length symbols or to decode variable-length symbols such as those found in an MPEG bitstream.

19 Claims, 2 Drawing Sheets

PROCESSING CIRCUIT AND METHOD FOR VARIABLE-LENGTH CODING AND DECODING

This is a continuation of the prior application Ser. No. 09/750,383, filed Dec. 21, 2000, now U.S. Pat. No. 6,507, 293 which is a CIP of PCT/US99/14560, filed Jun. 24, 1999, which claims priority to Ser. No. 60/090,648, filed Jun. 25, 1998, the benefit of the filing dates of which are hereby claimed under 35 USC 119(e) and 35 USC 120.

TECHNICAL FIELD

The invention relates generally to image processing circuits and techniques, and more particularly to a processing circuit and method for the variable-length coding and encoding of data such as video data.

BACKGROUND OF THE INVENTION

Variable-length codes are used to encode many types of data. For example, the popular block-based Motion Picture Experts Group (MPEG) video compression standard encodes video data as variable-length symbols for transmission or storage. In addition, many types of variable-length codes, such as Huffman codes, are lossless.

Typically, variable-length encoded data is transmitted serially. Therefore, the transmission, reception, and decoding of such data are relatively time consuming as compared with data that can be transmitted, received, or decoded in parallel.

To decrease the transmission, reception, and decoding times, circuit hardware has been developed to process such data. That is, the architecture of such hardware is configured to efficiently implement the variable-length decoding or encoding process. A problem with such hardware, however, is that it is typically designed for a specific type of variable-length code. Therefore, hardware designed to encode or decode data according to one type of variable-length code may be inefficient or unable to encode or decode data according to another type of variable-length code. But many bit streams such as some MPEG bit streams include bit segments that are respectively encoded according to different variable-length codes. Therefore, decoding hardware often must include multiple circuits each designed to decode bit segments according to a respective variable-length code. Unfortunately, this often increases the size, complexity, and cost of the decoding hardware.

Another alternative is to program a processor to perform the variable-length encoding or decoding. Therefore, for bit streams using more than one variable-length code, one can change the processor software "on the fly," and thus perform all of the encoding or decoding with a single processor. Unfortunately, because the architectures of most processors are not optimized for variable-length encoding or decoding, such processors are relatively slow when variable-length encoding or decoding data. Therefore, it is often difficult or impossible for such processors to variable-length encode or decode data in real time.

SUMMARY OF THE INVENTION

In one aspect of the invention, a variable-length encode/decode processor includes a central processing unit, and includes an instruction buffer and a getbits processing engine coupled to the central processing unit. Such a processor can be used to encode data as variable-length symbols or to decode variable-length symbols such as those found in an MPEG bitstream.

Data compression schemes such as Huffman encoding use variable length codes (VLCs). Video compression standards such as MPEG use VLCs; for example, the following are legal MPEG codes:
'00'
'01'
'110'
'000000000000000000000001'

In a stream of these types of symbols, the second symbol in the stream cannot be decoded until the length and semantics of the first is known. This is an inherently serial process that can be efficiently performed by a dedicated small programmable engine.

For this reason, a video processor such as the Map1000 processor benefits from inclusion of a "VLx processor", an engine dedicated to the processing needs of variable-length data such as that within an MPEG stream. The VLx processor allows flexibility in the processing of incoming bitstreams and in how that information about that bitstream is relayed back to the Map1000. Efficient processing has been achieved by designing the hardware to minimize critical loops in processing variable length data and to save memory by using a compressed set of tables.

The general design intent was to fulfill the following requirements:

Handle a High Definition Television (HDTV) MPEG stream at 19.4 MBits/sec into an 8 MBit Video Buffering Verifier (VBV) buffer.

Generate decimated coefficients to display HDTV at MP@ML resolutions

Simultaneously handle encoding and decoding of Main Profile at Main Level (MP@ML) streams For a task such as the decoding of HDTV MPEG streams, the VLx processor might perform the following types of activities based on the program that it executes:

Preprocess an MPEG stream to build structures that define the content of the stream Decode Discrete Cosine Transform (DCT) coefficients Create an MPEG stream The VLx processor is fed bitstreams by Map1000 tasks in one of two ways. It can process data that is placed in the Coprocessor Memory Bank, or it can take input bitstreams through I/O channels that are fed by the Map1000 Data Streamer unit.

The resultant information, decimated bitstreams, or newly constructed streams are transferred back to the MAP1000 through memory transfers or as I/O output bitstreams.

The VLx processor consists of a simple processing engine, a set of dedicated registers, a GetBits engine for handling bitstreams and I/O interactions, optimized access to the FFB for Coprocessor Memory 1 (CM1) access and a way to issue a DsContinue( ) operation to the Data Streamer.

DETAILED DESCRIPTION OF THE INVENTION

As the digital revolution takes hold and all forms of media such as film, audio, and video become digital, the need for the acquisition, processing, display, storage, and communications of such media data has spurred rapid technology development. By taking advantage of these emerging technologies, many new applications have become possible and existing applications strengthened with improving cost/performance ratios. Digital video, desktop video teleconferencing, machine vision, digital cameras/camcorders and medical imaging are several such examples. Image and video computing algorithms and their fast implementations are some of the core enabling technologies for such applications. Because of the vast market potential, consumer products employing real-time digital video computing have been generating a great deal of excitement among both manufacturers and consumers. The real-time aspect and consumer-level focus of such systems require high computational power at very low cost and optimal implementations of key algorithms. In prototyping and designing these systems, a programmable approach provides flexibility and adaptability to new applications and changing requirements, which is a definite advantage over specialized hardwired solutions.

Figure 1:
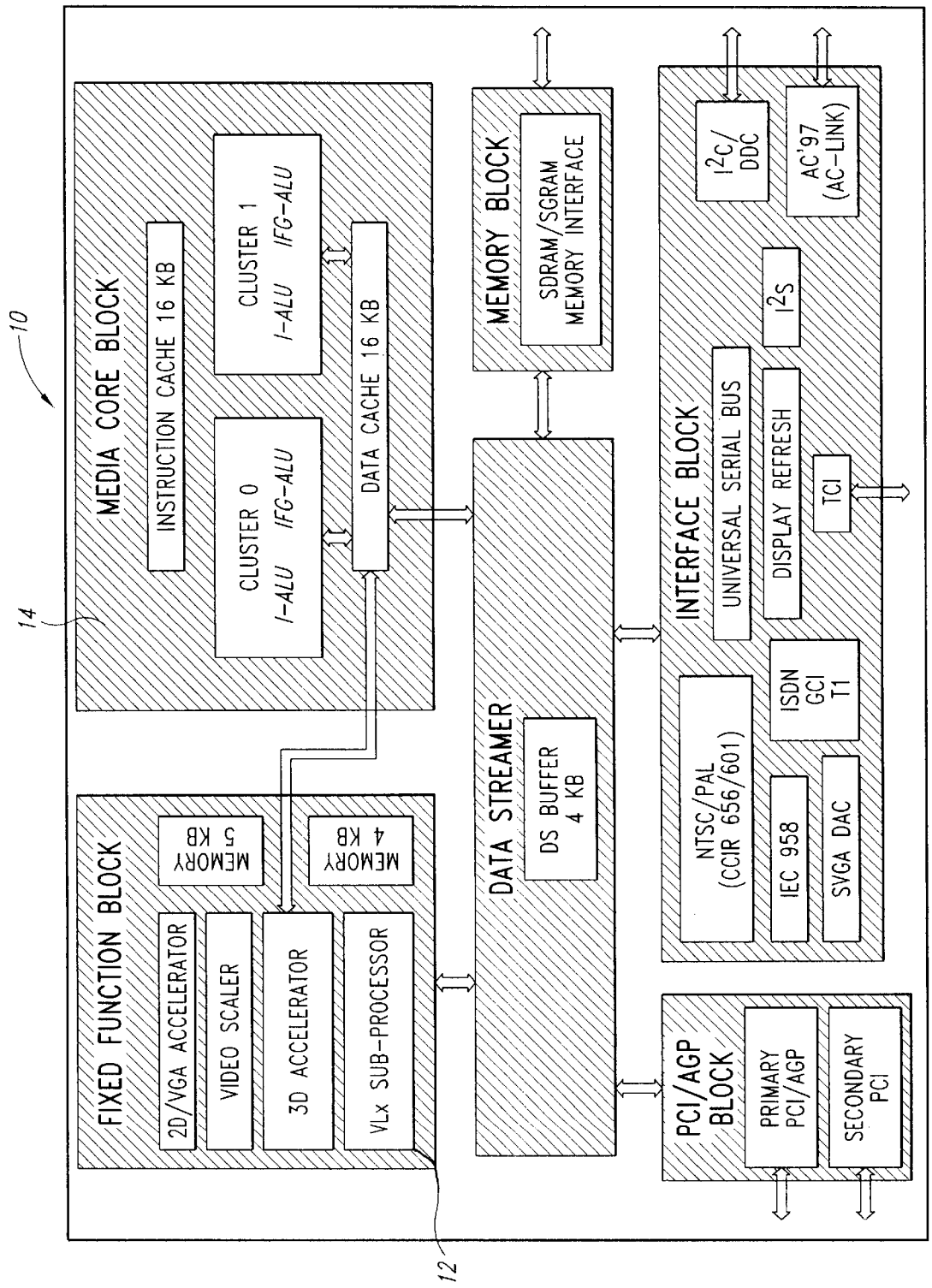
FIG. 1 is a block diagram of a media processing circuit that includes a variable-length encoder/decoder processor according to an embodiment of the invention.

FIG. 1 is a block diagram of a media processor 10 that includes a Fixed Function Block (FFB) 11 and a variable-length coder/decoder (VLx) processor 12 according to an embodiment of the invention. In one embodiment, the processor 10 is a MAP 1000 processor produced by Equator Technologies of Seattle, Wash. Because many billions of operations per second are needed to perform media processing in real time there has been great demand for processors capable of much higher computational power than previously available. The MAP 1000, a revolutionary new low-cost programmable single-chip solution which has been designed to meet the demanding compute requirements of digital media processing including:

digital video: MPEG2 encoding and decoding, video pre/post filtering, and H.324 video conferencing digital audio compression: 5.1 channel AC3 and MPEG2 encoding and decoding imaging: Joint Photographic Experts Group (JPEG) encoding and decoding, wavelet transforms 3D graphics:

2D graphics telephony digital audio synthesis digital audio spatialization

The high degree of computational power available on the MAP 1000 makes it one of the most powerful processors in the world today. The MAP 1000 uses on-chip parallelism via a technique known as instruction-level parallelism to achieve such high computation rates. Instruction-level parallelism allows for multiple Central Processing Unit (CPU) operations to be initiated in a single clock cycle. This is done by having multiple on-chip execution units and/or by partitioning a particular execution unit into multiple smaller units (e.g., a 64-bit Arithmetic Logic Unit (ALU) is split into eight 8-bit ALUs).

The construction or interpretation of media bitstreams such as those used in the MPEG, JPEG, or Dolby AC3 however, is an inherently sequential process. Each symbol or structure within the bitstream takes its interpretation from the symbols that have preceded it. And the length of each symbol is either known a priori based on context or is encoded as a length value within the bitstream preceding the symbol value itself. This means that all of the parallelism of the MAP 1000 would go wasted when performing media bitstream encoding or decoding.

To make the encoding or decoding of media bitstreams vastly more efficient, Equator Technologies has developed the integrated VLx processor 12, which is disposed within the Map 1000 processor 10, to supplement parallel processing of Map 1000's core 14. The VLx processor 12 is dedicated to the processing needs of variable-length data such as that within a media stream. The VLx processor 12 allows flexibility in the processing of incoming bitstreams and in how that information about that bitstream is relayed back to the core 14 of the Map1000. Efficient processing has been achieved by designing the hardware to minimize critical loops in processing variable length data and to save memory by using a compressed set of tables.

The VLx processor 12 is thus essentially a 16-bit sequential RISC microprocessor with many special features to help with bit parsing. By using the VLx for the sequential bit-parsing algorithms, the parallel core 14 is free to run more parallel code efficiently and concurrently with the VLx processor 12. Because the VLx processor 12 is completely programmable, it can be used for other bit-serial conditional tasks such as the acceleration of Viterbi, Reed-Solomon, or JBIG processing. The VLx processor 12 is integrated with the rest of the MAP 1000 on-chip circuits as illustrated in FIG. 1.

In one embodiment, the VLx processor 12 is designed meet the following requirements:

Handle HDTV MPEG stream at 19.4 MBits/sec into an 8 MBit VBV (buffer).

Generate decimated coefficients to display HDTV at MP@ML resolutions.

Figure 2:
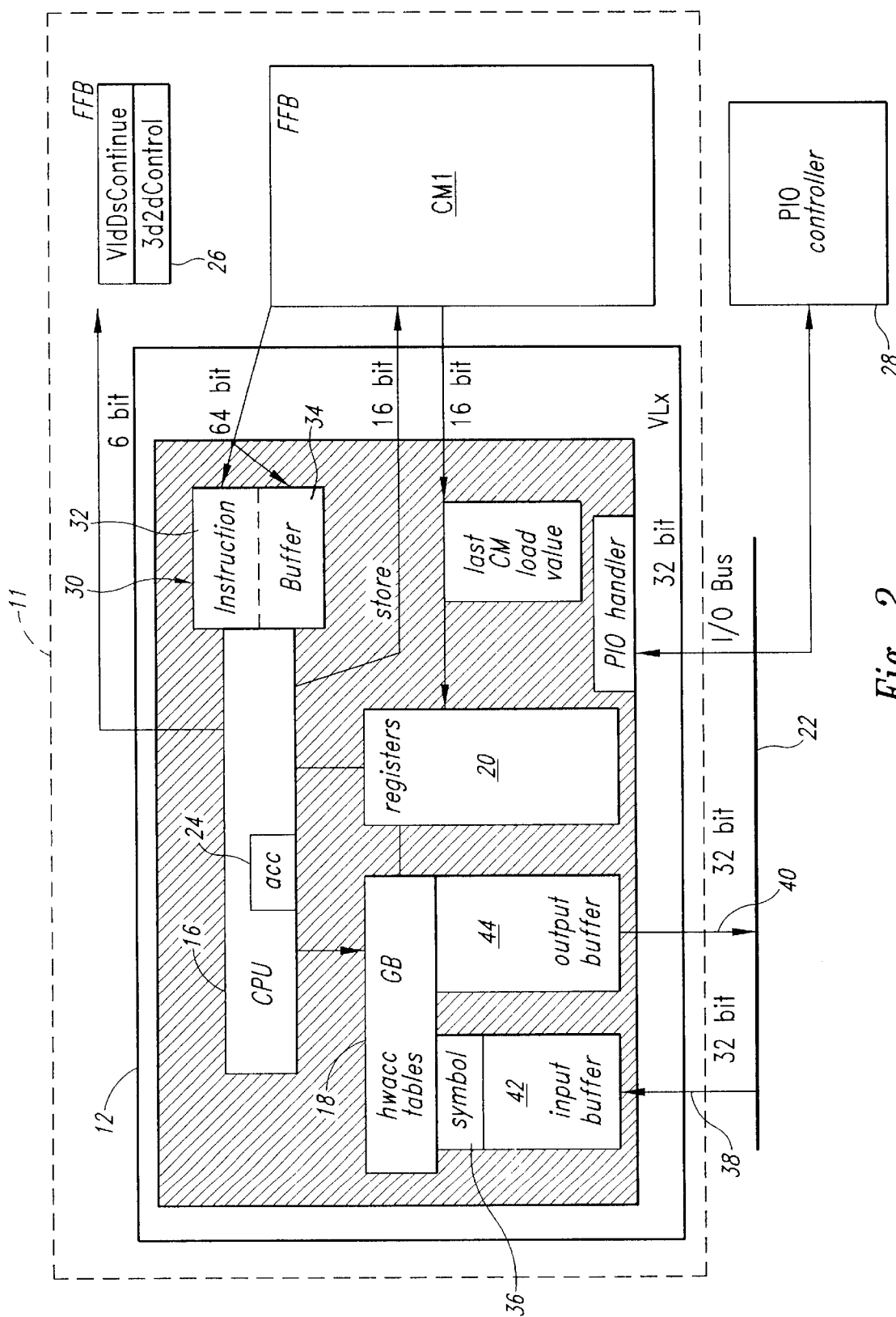
FIG. 2 is a block diagram of the variable-length decoder/encoder processor of FIG. 1 and peripheral circuitry according to an embodiment of the invention.

FIG. 2 is a block diagram of the VLx processor 12 of FIG. 1 and portions of the FFU 11 of FIG. 1 according to an embodiment of the invention. The VLx processor 12 includes a 16-bit CPU 16 and a GetBits (GB) processing engine 18, which communicates with the CPU 16 and which also functions as an input/output (I/O) device. The CPU 16 and GB engine 18 have access to a register file 20, which includes 32 general-purpose registers. The FFB 11 includes a coprocessor memory bank 1 (CM1), which the CPU 16 can access for both instruction prefetch operations and load/store operations. The GB engine 18 can both consume and produce data on an I/O bus 22.

The CPU 16 operates on the 32 registers in the register file 20, and these registers, although not shown individually in FIG. 2, are labeled r0–r31. Of these 32 registers, the CPU 16 and the GB engine 18 share access to 13 of the registers, r0–r12, for special table processing. There are also virtual registers (discussed below) which share addressing ports with 4 of the general-purpose registers r0–r3. These virtual registers are read-only, and that they are a view into some state of the machine that can change as a side-effect of instruction processing. Up to two registers in the register file 20 can be specified in an instruction. The first register denoted in the instruction is labeled R1. The second register, if specified, is denoted R2. The positioning of the register determines the interpretation of the virtual register specification.

The R1 register is the destination for result writebacks if the writeback version of the instruction is used. The instruction will also be available in the acc virtual register 24 on the cycle following the execution of the instruction.

The general registers r4–r31 can be read from and written to by instructions. As stated above, the general registers r0–r3 share their address port with the virtual registers. These four general registers can only be written by a RAM read (LD.W) instruction. Any attempt to read these register locations will result in a read to the virtual register value.

The GB 18 is able to read general registers r0–r3 as part of DCT processing.

In one embodiment, these is a one-cycle latency on register writeback. This means that the register contents for the modified register are available only for the next instruction in the acc virtual register 24.

As stated above, the virtual registers share addressing ports with four of the general-purpose registers r0–r3. This means that if these registers are accessed by the CPU 16, the value used is going to come from some state of the machine and not the general register.

The virtual registers cannot be written to. Writeback to a virtual register will cause the general register that shares the virtual register port to be written. The VLx assembler (not shown) recognizes the virtual registers by name and will flag write or writeback operation attempts to these virtual registers.

The GB 18 uses the registers r0–r12 in a DCT processing mode. When the GB 18 is accessing these registers, access by the CPU 16 to the register file 20 will result in a register file conflict. Thus, the CPU 16 is not permitted to access the register file during a cycle in which the GB 18 is accessing the register file 20. The registers r0–r12 are read by the GB 18 so that appropriate lookup tables for DCT-coefficient processing can be addressed. Example code for DCT processing is designed so as to avoid these register conflicts between the CPU 16 and GB 18. The following table depicts a summary of register use.

control register 26 is in Variable Length Decode (VLD) mode. Thus, requests from the VLx processor 12 to access CM1 take priority over requests from circuit components external to the FFB 11 to use the memory CM1.

The VLx processor 12 addresses the memory CM1 with 16-bit addresses, where 0000 specifies the first 16-data-bit location in CM1 and FFFF specifies the last 16-data-bit location in CM1.

The CPU 16 is now discussed in more detail. The CPU 16 is a 16-bit processing unit that supports simple arithmetic operations (adds, subtracts, shifts) on the 32 16-bit registers in the register file 20. The CPU 16 can also initiate loads/stores from/into CM1. Special instructions control the GB 18. The clock (not shown in FIG. 2) for the CPU 16 can be stopped/started via the VLx PIO register (not shown in FIG. 2) setting.

The CPU 16 continually processes instructions that have been prefetched into its instruction buffer 30. The instruction buffer 30 holds 8 16-bit instructions in 2 4-instruction subregisters 32 and 34. The CPU 16 initiates instruction prefetch of 4 16-bit instructions (64 bits total) in time to prevent the stalling of the instruction pipeline except in the case of a branch or when three consecutive load/store operations prevent instruction prefetch from happening in time for use. A special mode of the CPU 16 called fastbranch

TABLE I

Register Summary

| Register | Virtual Register Mnemonic | Used by GB as table base for DCT processing | Value when in R1 position | Value when in R2 position |
|---|---|---|---|---|
| r0 | acc | yes | last ALU result | last ALU result |
| r1 | dctsign, run | yes | Gbsign ? 0: (RF[425]<10:5>) << 1 | value of bits 15:11 of last CM load value plus 1 |
| r2 | symbol | yes | first 16 bits of GB input buffer interpreted by GB mode | first 16 bits of GB input buffer interpreted by GB mode |
| r3 | isZero, nZero | yes | 0 for ALU instructions | GB count of leading 0 or 1 bits in symbol |
| r4 . . . r12 | | yes | RF[register] | RF[register] |
| r13 . . . r24 | | | RF[register] | RF[register] |
| r25 | lev | | RF[register] | value of bits 10:5 of last CM load value if call.dct was used |
| r26 . . . r31 | | | RF[register] | RF[register] |

The R1 and R2 positions are described on page 26, section 5 of the proposed data sheet for the processor 10 (FIG. 1). This proposed data sheet is attached as Appendix A.

The VLx processor 12 uses coprocessor memory such as CM1, which is located in the FFB 11. In one embodiment, CM1 is a 4 KB region of memory. When the FFU 3D2D control register 26 is in a VLD mode, the VLx processor 12 has a one-cycle turnaround to memory requests (either 64-bit instruction fetches or 16-bit loads/stores) and the memory bank CM1 cannot be used by any other component of the FFB 11, such as the 3D accelerator (FIG. 1).

The memory region CM1 is only accessible to circuits and components external to the FFB 11, such as the Data Streamer (FIG. 1) or PIO controller 28 when the FFU 3D2D allows the CPU 16 to loop executing the instructions in the instruction buffer 30 without performing any instruction prefetch.

The CPU 16 begins executing instructions at the beginning memory location of CM1 (offset 0 from whatever base address of CM1 is chosen) in response to a PIO reset, and the VLx processor 12 clock (not shown in FIG. 2) is enabled at the same time. The CPU 16 decodes and then executes one instruction per cycle, with the results of the instruction execution for arithmetic and logical operations being available in the acc virtual register 24 in the next cycle. Optional register writebacks are done in the following cycle. The VLx CPU pipeline has three stages, as depicted in Table 2.

TABLE II

VLx CPU Pipeline

| | |
|---|---|
| R/D | Instruction decode, register read |
| EX | Operation execution |
| WB | [optional] writeback of results |

The instruction prefetch is ongoing, happening once within every 4 cycles unless a branch occurs. In the case of a branch, instruction prefetch for a target instruction and ones following to fill the instruction buffer 30 will occur potentially in 2 consecutive cycles. During a branch, the CPU pipeline will suspend processing for 3 cycles as the branch target is calculated, read from CM1, and then decoded.

The VLx instruction set is described in detail later in the description. The instructions fall into the following categories:

- Arithmetic operations, logical, and shifting operations such as add, subtract, and, or, xor, shift left, shift rights, and endian swap
- Branch operations, goto, branch on condition, fastbranching
- GB control operations
- CM1 load/store operations Still referring to FIG. 2, the GB 18 is now described. The GB 18 functions both as a large bitshifter and an I/O device. It is designed to help in the encoding or decoding of variable-length code words in a bitstream. In addition, it has special logic for interpretation of parts of an MPEG2 bitsteam so that it assists in DCT coefficient extraction or construction of a motion vector.

The GB 18 has the following capabilities:

- Perform a per byte bit reversal on incoming bits from the I/O input bitstream (received on the I/O bus 22 via the Data Streamer of FIG. 1). This keeps MPEG2 bits handled by the GB 18 in a contiguous order so that the GB 18 can function as a giant shifter.
- Perform a per byte bit reversal on outgoing bits on the I/O output bitstream (sent to the Data Streamer of FIG. 1). This preserves the appropriate endianess for interaction with a Very Long Instruction Word (VLIW) program.
- Shift in data from the I/O input stream and make the first 16 bits of this data available in a symbol virtual register 36 for use by the program, an optionally causing shifted bits to be placed in the output stream.
- Endian swap the view of the value stored in the symbol virtual register 36.
- Use the current value stored in the symbol virtual register 36 to lookup the result value in a limited set of hardware encoded MPEG2 tables, and then return the table value to the symbol virtual register 36.
- Use the current value stored in the symbol virtual register 36 in conjunction with general-purpose registers r0–r12 in the register file 20 to return an address of CM1 to the symbol virtual register 36.
- Splice data into the output stream.
- Save and restore bitstream I/O state information so that other I/O bitstream pairs can be handled.

The GB 18 is controlled by the CPU 16. The CPU 16 controls the GB 18 by specifying an operation and up to two operands. The operation is specified as the K1 operand in the VLx instruction. The first GB operand comes directly from the GB instruction in the VLx instruction at location K1. The second GB operand, optional based on operation type, is taken from the K2 or R2 operand value of the instruction. (The K2 and R2 operands are discussed in more detail hereafter. Some GB 18 operations require additional information. This information may come from the last CPU 16 result state made visible in the acc virtual register 24 of the VLx instruction immediately following the one containing the GB operation.

The GB pipeline varies according to the GB operation. There are a couple variants on the pipeline. The first pipeline is one when bits are being shifted out of the input buffer 42. A second pipeline is for splicing bits into the output buffer 44. A third pipeline is for saving/writing the GB configuration. A fourth pipeline is for hardware-accelerated table lookup values. These are not true pipelines in that each state of the pipeline is not manipulating unique resources. Instead, the GB operation should be viewed as being 2 to 4 cycles in latency. A summary of the GB pipelines is shown in Table 3.

TABLE III

GB Bit Shift Operation Pipeline

| | |
|---|---|
| Decode | Receive and decode VLx CPU directive |
| Get GB Sign | Based on the bitshift length, determine the Gbsign which is used in determining dctSign |
| Shift and Count | For GB shifting operations, shift the appropriate number of bits from the input buffer; will yield an updated symbol value; count the number of leading one or zero bits depending on how GB is configured; will yield an updated nZero value. This may optionally splice consumed bits into the output buffer 44. |
| DCT lookup | If in DCT mode, read tbase[nZero] register and calculated table index; yields an updated symbol value. Se "DCT Processing" on page 24. |

Additional details of the VLx processor 12 are discussed below and in Appendix A.

A summary of the processor 12 follows, followed by a description of the operation of the processor 12 including the operation of the CPU 16 and the GB 18.

Features

The VLx processor 12 consists of a simple processing engine (the CPU 16), a set of dedicated registers (the register file 20), a GetBits engine (the GB 18) for handling bitstreams and I/O interactions, optimized access to the FFB 11 for CM1 access and a way to issue a DsContinue( ) operation to the Data Streamer (FIG. 1).

The VLx processor 12 components are summarized in the following table and sections:

TABLE IV

| Component | Function |
|---|---|
| 16-bit 200 MHz CPU 16 | processes VLx instructions read from FFB11, CM1 |
| instruction buffer 30 | holds 8 16-bit instructions |
| Registers 20 | 32 16-bit registers r0–r31 (4 port); some special purpose; some general purpose |
| Memory CM1 | Optimized access to FFU 11 CM1 RAM; requires that no other FFU unit use CM1 while the VLx is operating. |
| GetBits engine 18 | optimized processing of data received from and sent out over I/O bus 22; sends and receives data 4 bytes at a time |

VLx Processor General Operational Overview

The VLx CPU 16 executes instructions that are read from the CM1 RAM into the VLx instruction buffer 30. These instructions set VLx register values, perform simple arithmetic operations on the contents of registers, read and write information from CM1, allow flow of control in the instruction stream to be modified and control the I/O that occurs through the GB engine 18.

The VLx processor 12 can receive signals from the PIO controller 28. These signals allow the VLx clock (not shown in FIG. 2) to be turned on and off, the VLx program counter (not shown in FIG. 2) to be reset to the first instruction, and I/O input to the GB engine 18 to be enabled or disabled.

Communication with the core block 14 (FIG. 1) is via the FFB CM1 connection to the data transfer switch (not shown).

The VLx GB engine 18 is connected to the I/O Bus 22. The GB engine 18 can interact with up to two Data Streamer buffers (FIG. 1) at any one time—one of which supplies input streams, the other of which takes output.

VLx Register Description

The VLx CPU 16 operates on 32 16-bit registers in the register file 20. These registers are regular readable/writeable registers. Some of these registers share addressing ports with the virtual registers that can only be read since they are a way of examining state in the system that occurs as a result of execution of other instructions.

For regular registers, there is a 1 cycle latency on register writeback. This means that the register contents are not available for the next instruction following an instruction that modifies the register. If the value is needed, the following instruction can use the accumulator value in the virtual register acc 24 that is always set with the results of a mathematical operation. For example

Writeback the results to zzin of incrementing zzin by 1
ADD_K(W, zzin, 1);
zzin value not available to the following instruction. Use
   acc SHL_K(0, acc, 2);
zzin value is now available.

There are several virtual registers, the most notable of which is the accumulator acc virtual register 24. The following table describes these special registers. Note that the register symbolic names, and not the register index values, should be used within the VLx programs since the actual index values may still be subject to change. Also note that several of these virtual registers have values that are specific to the MPEG2 decoding processing and the interaction with the GB engine 18 for this purpose.

TABLE V

Actual Values Used When Instruction Operand RI1 References a Virtual Register

| Register Index | Register Kind | Assembler - Symbolic Name for Operand | Value Used | Indirect Source |
|---|---|---|---|---|
| 0 | virtual | acc | Last result | accumulator |
| 1 | virtual | reserved | reserved | GB engine 18 |
| 1 | virtual | dctsign | GBsign ? 0 (from iszeroR1) :(bits <10:5> of RF[R12]) << 1 | GB engine 18 |
| 2 | virtual | symbol | GBSymbol | GB engine 18 |

TABLE V-continued

Actual Values Used When Instruction Operand RI1 References a Virtual Register

| Register Index | Register Kind | Assembler - Symbolic Name for Operand | Value Used | Indirect Source |
|---|---|---|---|---|
| 3 | virtual | iszeroR1 | 0 | — |
| 4 . . . 12 | real | tbase* | RF[RI1] | — |
| 14 . . . 31 | real | | RF[RI1] | — |

TABLE VI

Actual Values Used When Instruction Operand R12 References a Virtual Register

| Register Index | Register Kind | Assembler - Symbolic Name for Operand | Value Used | Indirect Source |
|---|---|---|---|---|
| 0 | Virtual | acc | Last result | accumulator |
| 1 | Virtual | reserved | | |
| 1 | virtual | reserved | | |
| 2 | virtual | symbol | GBSymbol | GB engine 18 |
| 3 | virtual | nzero | GBnzero | GB engine 18 |
| 4 . . . 12 | real | tbase* | RF[R12] | — |
| 25 | virtual | lev | bits <10:5> of RF[25] | — |
| 14 . . . 31 | real | | RF[R12] | — |

FFB CM1 Description

The VLx processor 12 requires a prioritized access path to CM1. While the VLx processor 12 is using CM1, CM1 cannot be used by any other FFB 11 unit, such as the 3D accelerator (FIG. 1). CM1 is allocated for use by the VLx processor 12 by setting the 3D2D Control Register 26 so that it specifies allocating by the VLx processor 12.

CM1 load and store operations typically have a 1-cycle latency from VLx processor time of issue. However, arbitration to CM1 within the FFB 11 will allow other components of the MAP1000 processor 10 (FIG. 1) to access CM1, and this can cause increased latency that is dependent on the size of the external request. The arbitration algorithm always gives preference to the VLx processor 12 over external requests such as made by the Data Streamer (FIG. 1). Other components that may have a need to access CM1 while the VLx processor 12 is executing include the Data Streamer which may be pulling or pushing data into or from CM1 as needed by the VLx application.

The VLx processor 12 can issue one memory operation per cycle. Memory operations include instruction prefetch, as well as memory load or store operations triggered as a result of executing VLx instructions that affect memory. For instruction prefetch, the VLx requests memory reads of eight bytes (four 16-bit VLx instructions). For instruction load/store operations, the VLx requests memory operations on 16-bit quantities.

If there are external requests to CM1 required, the VLx application should take this into account and be written such that there are cycles in which no memory accesses are made to CM1 so that external requests can obtain servicing time, preventing starvation.

VLx CPU Description

The VLx CPU 16 executes instructions described later in this chapter.

The processor operates on the 32 16-bit registers in the register file 20, which are described above. The CPU 16 also can read and write values into the CM1 memory space as described above. Execution of special instructions controls the GB engine 18 and other instructions allow the VLx application to issue a DsContinue( ) type operation to a descriptor program executing in the Data Streamer (FIG. 1).

Significant elements in the CPU 16 are:

Program counter (not shown in FIG. 2)

Instruction prefetch buffer 30

Instruction execution logic (not shown)

Accumulator (although the accumulator itself is not shown in FIG. 2, the value stored in the accumulator can be read by reading the virtual register acc 24)

The CPU 16 continually processes the instructions that have been prefetched into the instruction prefetch buffer 30. The instruction prefetch buffer 30 holds 8 16-bit VLX instructions. The CPU 16 initiates the instruction buffer prefetch from CM1 in enough time to prevent stalling the instruction pipeline except in the case of branching or execution of more than 2 instructions that operate on CM1 per 4 cycles. Each instruction prefetch loads four valid VLx instructions into the prefetch buffer 30.

The VLx processor 12 starts executing instructions at the beginning of CM1 (offset 0 from CM1). Instructions are decoded and then executed, one per cycle, with the results of the instruction execution for arithmetic and logical operations being available in the accumulator in the next cycle, and optionally written back to a result register on the subsequent cycle.

The VLx instructions fall into the following categories:

Arithmetic operations such as ADD, SUB, AND, OR, XOR, Shift Left Endian swap, Shift Right Endian swap Branch operations such as >, ==, Goto, branch on condition, indirect branching, and a fastbranch mechanism GetBits control operations Memory load store operations.

The CPU's 16-bit instruction words consist of a 5-bit opcode together with several operands. The instruction set includes several classes of operations, and also includes special opcodes for control of and interaction with the GB engine.

The IOIF Fastbranch operation is included to speed looping under certain conditions. It allows the VLx processor's CPU 16 to iterate in place using its internal instruction buffer 30 only. This both eliminates calls to CM1 for instructions and provides a no-delay branch to the top of the instruction loop, which improves speed.

PIOs to VLx Processor

The VLx processor 12 has one 32-bit PIO readable/writeable value with values read or written according to the bits below:

TABLE VII

| Bit(s) | Name | Description |
|---|---|---|
| 0 | Run | If set to 1, turns on VLx clock; otherwise turn off VLx clock |
| 1 | Step | Step 1 clock cycle |

TABLE VII-continued

| Bit(s) | Name | Description |
|---|---|---|
| 2 | ResetPC | Sets PC to 0; marks contents of instruction buffer as invalid (forces out any fastbranch state) |
| 3 | Debug | Sets a debug breakpoint. If this bit is set, bits 7–15 specify the breakpoint address. |
| 4 | GBCooldown | Turns off request of I/O input on input stream |
| 5 | SetRFAddr | If set, use bit 10 to determine whether to read or write the register specified by bits 11–15 |
| 7–15 | Breakpoint or RAM Address | Breakpoint address if Bit 3 is set; RAM address if neither bit 3 nor bit 5 are set |
| 11–15 | RF Addr | Index into register file |
| 7 | GBPending | Set if there is I/O outstanding |
| 10 | WriteRF | If bit 5 set, if this is bit is set, write the value at bits 16–31 to the register specified by bits 11–15; otherwise read the register specified by bits 11–15 and put the value in bits 16–31 |
| 16–31 | RFData | Data to write to RF at index specified by bits 11–15 if WriteRF and ForceRF bits are set; otherwise data is *RI1. |

VLx Processor Pipe Stages

The VLx processor's main stages are as follows:

Prefetch: 64-bit prefetch into the instruction prefetch buffer 30

Decode: 16-bit instruction decode by CPU 16 from buffer and register file address set up Execution: instruction execution Writeback: write back of results to register in register file 20

Prefetch: The 64-bit prefetch is designed to fetch instruction data into the instruction prefetch buffer 30 on the assumption that the CPU 16 is executing in-line code. Each new 64-bit word is timed to arrive as the last instruction is loaded into the CPU 16. The CPU 16 can run with no stalls due to missing instructions on in-line code. Note that in one embodiment, the instruction prefetch buffer 30 size is 128 bits (8 instructions*16 bits per instruction) and 2 prefetch operations are required to fill the buffer 30.

Decode: The decode stage sets the register file addresses so that data from the register file 20 is ready when the execution stage arrives. Note that the execution of some instructions, such as READ_GB_x instructions, rely on the register-file addresses being set appropriately by instructions immediately following the READ_GB_x.

1st Stage Execution: The execution uses the data from the register file 20 or supplied constants as operands. The instruction is executed and results are available in the acc virtual register 24 in time for use by the next instruction's execution.

Writeback: Though the CPU 16 automatically places the results of arithmetic and logical instructions in the accumulator, if the programmer wishes to have the result be copied to another register, that action must be indicated through the WB field in the instruction. It takes one cycle to write back the results of the execution stage to a register. If a programmer wishes to use the results of an operation in the next cycle the acc virtual register 24 is used.

Branching

Branches take 3 cycles to execute. All branches are of an absolute nature. These can take an immediate operand (11 bits) or a register value. The CPU 16 does not execute any instructions after a branch op is received until the target is loaded.

Fast Branch

The fastbranch instruction (IOIF Fastbranch) defines a mode of operation where the CPU 16 halts instruction fetch from CM1 and executes code only within the instruction buffer 30. The advantage of this is that loops can be executed more quickly within code in the buffer 30 than when using code requiring fetches from CM1, since the branch to a user-specified offset occurs without delay in the buffer 30. This also frees up cycles for CM1 to be accessed by the Data Streamer (FIG. 1).

The instruction buffer 30 can hold up to eight instructions, and code in the buffer 30 must be aligned on an 8 word boundary. Using the fastbranch capability requires that the programmer predefine the number of instructions in the body of the loop. This number, whose range is 0 to 3, defines the address within the buffer 30 that the CPU wraps back to once the last instruction (8th in the buffer 30) is reached. This means that 5 to 8 instructions can be included in this loop.

GetBits Engine

The GB engine 18 in the VLx processor 12 is designed to assist the VLx processor 12 in decoding variable-length-coded symbols. GB 18 is designed to perform bit extraction and insertion operations on data received from the I/O Bus 22, and to assist in coefficient extraction. It is responsible for assembling the input data and doing part of the computation necessary to find the correct lookup table.

The GB engine 18 has the following basic capabilities:

Does a per byte bit reversal on incoming bits from the I/O input stream.

This keeps the bits handled by the GB engine 18 contiguous in the GetBits processing.

Does a per byte bit reversal on outgoing bits on the I/O stream. This preserves the appropriate endian values for interaction with the VLIW core 14 (FIG. 1).

Shifts in data from the I/O input stream and make this data available in the symbol virtual register 36, and optionally causing this data to also be placed on the output stream.

Endian swap the view of the bits in the I/O input stream

Counts the number of leading zero or one bits starting from the bitstream Most Significant Bit position (first bit received after per byte bit reversal) and makes this count available in the virtual register nzero (not shown in FIG. 2).

Can optionally use the current symbol value to lookup the resulting value in a limited set of hardware encoded MPEG2 tables, and then return the table value as the symbol value.

Can splice data into the output stream.

The GB engine 18 has two primary interfaces with the VLx CPU 16:

1. Via the register file 20
2. Simple control bits

The control bits are:

Run/Halt (from the VLx CPU 16 to GB 18)

Done/Busy (from GB 18 to the CPU 16)

Execution of VLx GB instructions by the CPU 16 configures and controls the GetBits operations. In order to perform appropriate configuration, information such as appropriate Data Streamer buffer and channel information must be passed to the VLx processor 12 so that it can configure the GB engine 18.

The GB engine 18 interacts with the I/O bus 22 using two of its slots on the I/O bus 22 at any given time. One of these slots 38 is used for an input stream. The other slot 40 is used for an output stream.

When the GB engine 18 is processing input, input data is moved into an input buffer 42. As GetBits operations are executed, the bits in the input buffer 42 are processed. The GB engine 18 makes read requests on the I/O bus 22 at the I/O bus rate to keep this input buffer 42 supplied with data. The I/O transfer size for input is 4 bytes.

The GetBits engine 18 can only process input data if it has been configured to read input, and if it has a sufficient quantity of unprocessed bits in its input buffer 42. A VLx program configures the GB engine 18 for input, and is responsible for checking to see if there is sufficient bits to process by using a special branch conditional instruction (BRACIND( . . . C_gbstall).

Output is generated to an output buffer 44 either through explicit placement of data (for example, through the G_splice) or as a side effect of shifting through symbols in the input buffer 42.

The GB engine 18 can only generate output if it has been configured to write output to the I/O bus 22, and if it has sufficient space in its output buffer 44 to write more bits out. When 4 bytes worth of valid bits have been written to the output buffer 44, the GB engine 18 will initiate a 4 byte I/O write transfer to the I/O bus 22.

The input buffer 42 size is 112 bits. The output buffer 44 size is 92 bits. Sufficient input data for GetBits processing exists in the input buffer 42 when there are at least 40 bits in the buffer 42. The output buffer 44 must have room for at least 21 bits for GetBits processing that affects output buffer state.

VLx Instructions

The CPU 16 is programmed in VLx assembly language. The instruction set is listed below:

Destination Control for Results

For instructions except BRACIND, the following holds true:

If the WB field of the instruction=0, then the results of the instruction are available from the acc virtual register 24 for arithmetic operations.

If the WB field=1, then the results of an instruction are copied the register addressed by the RI1 field of the instruction.

For the instruction BRACIND only, the effect of WB is different. For discussion, see description of BRACIND.

Instruction Format

The CPU's 16-bit instruction words have the following structure:

TABLE VIII

VLx Instruction Format

| Type | Field 1 - Opcode | Field 2 - Writeback Control | Field 3 - Operand (RI1) | Field 4 - Operand (RI2) |
|---|---|---|---|---|
| 1 | 5-bit opcode | 1-bit WB flag | 5-bit operand (register address) | 5-bit operand (register address) |

TABLE VIII-continued

VLx Instruction Format

| Type | Field 1 - Opcode | Field 2 - Writeback Control | Field 3 - Operand (RI1) | Field 4 - Operand (RI2) |
|---|---|---|---|---|
| 2 | 5-bit opcode | 1-bit WB flag | 5-bit operand (register address) | 5-bit operand (constant) |
| 3 | 5-bit opcode | 1-bit WB flag | 5-bit operand (constant) | 5-bit operand (register address) |
| 4 | 5-bit opcode | 1-bit WB flag | 5-bit operand (constant) | 5-bit operand (constant) |
| 5 | 5-bit opcode | 1-bit WB flag | 11-bit operand (address or constant) | — |

TABLE IX

Operands Used In Instructions

| Operand | Function |
|---|---|
| WB | The Write Bit has two uses: For all opcodes except Bracind, WB controls whether results of the operation are copied to a register in addition to the accumulator: 0 = operation results placed in the accumulator only. 1 = operation results are copied into the register addressed in the RI1 field. For the Bracind opcode, WB functions as follows: 0 = no change to RF[RI1] contents 1 = causes RF[RI1] to be set to the program counter value |
| RI1 | Register Index 1: a 5-bit register address indexing one of the 32 registers in the register file or one of the virtual registers. |
| RI2 | Register Index 2: a 5-bit register address indexing one of the 32 registers in the register file or one of the virtual registers |
| K5 | a 5-bit value |
| M11 | an 11-bit Coprocessor Memory 1 (CM1) memory address |
| K11 | an 11-bit value |

Instruction Descriptions

The format for instruction descriptions is shown below. MNEMONIC is the assembly language mnemonic for the instruction. WB is the value of the WB field. Arg1 and Arg2 are operands as described in Table 6 above. All cycle counts are in VLx clock cycles for a 200 MHz VLx clock.

ADD_K(WB,RI1,K5)

Cycles: 1 for results to virtual register acc 24;
2 for results to any other available register (typically in the register file 20).

Function: Add constant K5 and the contents of register RI1.

Example: ADD_K(0,tbase12,0)

Description: The example sums the value 0 and the contents of register tbase12. The result of the operation is available in the acc virtual register 24 in the following cycle.

ADD_R(WB,RI1,RI2)

Cycles: 1 for results to virtual register acc 24;
2 for results to any other register.

Function: Add the contents of register RI2 and the contents of register RI1.

Example: ADD_R(1,pctype,acc)

Description: The example sums the contents of the virtual register acc 24 with the contents of the register symbolically addressed as pctype and makes the results available in the virtual register acc 24 in the subsequent cycle, and in the pctype register for use in 2 cycles.

SUB_K(WB,RI1,K5)

Cycles: 1 for results to virtual register acc;
2 for results to any other register.

Function: Subtract constant K5 from the contents of register RI1.

Note that SUB may be use to negate a value in one step by using the is zero virtual register to supply the constant zero allows one step negation using SUB_K(0,is zero,reg).

Example: SUB_K(0,acc,1)

Description: Subtract 1 from the virtual register acc 24 and make the results available in acc 24 for the next instruction.

SUB_R(WB,RI1,RI2)

Cycles: 1 for results to virtual register acc 24;
2 for results to any other register.

Function: Subtract the contents of register RI2 from contents of register RI1.

Example: SUB_R(0,5,3)

SHL_K(WB,RI1,K5)

Cycles: 1 for results to virtual register acc 24;
2 for results to any other register.

Function: Shift contents of register RI1 left by a number of bits equal to the value at bit positions 0:3 of K5. All shift operations result in zeros being shifted in to fill vacant bits. Note that the value of bit 4 of K5 controls whether endian swapping is done before the shift operation, as follows:
Value of K5[4]=
1: endian swap then shift left by number of bits=K5[3:0]
0: only shift left by number of bits=K5[3:0].

SHL_R(WB,RI1,RI2)

Cycles: 1 for results to virtual register acc 24;
2 for results to any other register.

Function: Shift contents of register at index RI1 left by a number of bits equal to the value at bit positions 0:3 in register RI2. (That is, shifts may be from 0 to 15 bits.) All shift operations result in zeros being shifted in to fill vacant bits. Note that the value of bit 4 of the contents of register RI2 controls whether endian swapping is done before the shift operation;
If value of bit 4 of RI2 contents=
1: endian swap then shift right by amount=RI2[3:0]
0: only shift right by amount=RI2[3:0].

SHR_K(WB,RI1,K5)

Cycles: 1 for results to virtual register acc 24;
2 for results to any other register.

Function: Shift right the contents of register RI1 by K5 bits. All shift operations result in zeros being shifted in to fill vacant bits. Note that bit 4 of K5 controls whether endian swapping is done before the shift operation, as follows:
Value of K5[4]=
1: endian swap then shift left by amount=K5[3:0]
0: only shift left by number of bits=K5[3:0].

Example: See below:

TABLE X

Examples of SHR_K Instruction

| OPERATION | DATA | RESULT |
|---|---|---|
| | 1110 0000 0000 1011 | |
| SHR_K(0,acc,0b10000) | 1101 0000 0000 0111 | Simple endian swap |
| SHR_K(0,acc,0b11000) | 0000 0000 1101 0000 | Swap then shift right 8 bits |
| SHR_K(0,acc,0b01000) | 0000 0000 1110 0000 | Simple shift right 8 bits. |

SHR_R(WB,RI1,RI2)
- Cycles: 1 for results to virtual register acc 24;
  2 for results to any other register.
- Function: Shift right the contents of register at index RI1 by number of bits equal to the value in the register at RI2. All shift operations result in zeros being shifted in to fill vacant bits. Note that the value of bit 4 of the contents of register RI2 controls whether endian swapping is done before the shift operation, as follows:
  Value of bit 4 of RI2 contents=
    1: endian swap then shift right by amount=RI2[3:0]
    0: only shift right by amount=RI2[3:0].

AND_K(WB,RI1,K5)
- Cycles: 1 for results to virtual register acc 24;
  2 for results to any other register.
- Function: Logical AND the contents of register RI1 with the constant K5.

AND_R(WB,RI1,RI2)
- Cycles: 1 for results to virtual register acc 24;
  2 for results to any other register.
- Function: Logical AND the contents of register RI1 with the contents of register RI2.

OR_K(WB,RI1,K5)
- Cycles: 1 for results to virtual register acc 24;
  2 for results to any other register.
- Function: Logical OR the contents of register RI1 with the constant K5.

OR_R(WB,RI1,RI2)
- Cycles: 1 for results to virtual register acc 24;
  2 for results to any other register.
- Function: Logical OR the contents of register RI1 with the contents of register RI2.

EXOR_K(WB,RI1,K5)
- Cycles: 1 for results to virtual register acc 24;
  2 for results to any other register.
- Function: Exclusive-OR the contents of register RI1 with constant K5.

EXOR_R(WB,RI1,RI2)
- Cycles: 1 for results to virtual register acc 24;
  2 for results to any other register.
- Function: Exclusive-OR the contents of registers RI1 and RI2 and place results in the accumulator.

COPY OPERATIONS

SETREG(WB,RI1,acc)
- Cycles: 1 for results to virtual register acc 24;
  2 for results to any other register.
- Function: Copy accumulator contents to register RI1.
- Example: SETREG(1,5,acc)
- Description: The example copies the contents of the virtual register acc 24 to register 5. Note that WB=0 causes no action and is functionally equivalent to a NOP.

SET_K(K 11)
- Cycles: 1 for results to virtual register acc 24;
  2 for results to any other register.
- Function: Copy the 11-bit constant K11 into the virtual register acc 24.
- Example: SET_K(0b0000001000)
- Description: Set virtual register acc 24 to value 0b0000001000.

READ_R(WB,RI1,RI2)
- Cycles: 1 for results to virtual register acc 24;
  2 for results to any other register.
- Function: Read value into register RI1 from CM1 location addressed by the contents of RI2.
- Example: READ_R(W,resa,acc)
- Description: Set value in register resa=value in RAM[acc]

WRITE_R(WB,RI1,RI2)
- Cycles: 1 for results to virtual register acc 24;
  2 for results to any other register.
- Function: Write value of RI1 into CM1 at location addressed by the contents of RI2.

BEQ0(K11)
- Cycles: 3 NOPs until target is loaded.
- Function: Branch to location K11 if virtual register acc 24 is 0.
- Example: BEQ0(0b000011110101)

GOTO(K11)
- Cycles: 3 NOPs until target is loaded.
- Function: Goto location K11.
- Example: GOTO(0b00000000011)
- Description: Sets program counter to 0b00000000011.

BGT0
- Cycles: 3 NOPs until target is loaded.
- Function: If virtual register acc>0 then branch to location K11.
- Example: BGT0(jumploc1)

BRACIND(WB,RI1,K5)
- Cycles: 3 NOPs until target is loaded.
- Function: The Branch Conditional Indirect instruction provides branch control. The user mask K5 used to determine which conditions to test for the conditional branch. There are four mutually-exclusive groups or conditions. Within a particular condition group, the BRACIND instruction test for up to three conditions simultaneously. All of the simultaneously tested conditions must be true in order for the branch to be taken. The destination will be the address whose value is held in the register file RI1. The current program counter value will be written to RI1 if WB is set.
- WB=0 If branch condition is not detected, RI1 content is unchanged.
- WB=1 If branch condition is detected, put the current PC value in RI1. (This allows setup for return from a subroutine call.)
- K5: Mask value comprised of four mutually-exclusive groups. Each group can test for up to three conditions simultaneously.

The test conditions are as follows:

TABLE XI

| Cond. Group | Cond. Name | K5 Value | Cond. Description |
|---|---|---|---|
| Group 1 | C_gbpend | 00100 | Whether any IO Bus event is pending |
| | C_gbloopp | 00010 | Reserved - special function |
| | C_dts | 00001 | Whether a DTS continue is allowed |
| Group 2 | C_gbstall | 01100 | Whether the GetBits engine is stalled |
| | C_eq0 | 01010 | Whether current results = 0 |
| | C_4eq0 | 01001 | Whether rightmost 4 bits of current results = 0 |
| Group 3 | C_always | 10100 | Always take branch |
| | C_8eq0 | 10010 | Whether rightmost 8 bits of current result = 0 |
| | C_lsb | 10001 | Whether register file input is ! = 0 |
| Group 4 | C_gbstall2 | 11100 | same as Gbstall |
| | C_lt0 | 11010 | Whether current results < 0 |
| | C_gt0 | 11001 | Whether current results > 0 |

The following operations can be tested simultaneously:

C_gbpend, C_gbloop, C_dts

C_gbstall, C_eq0, C_4eq0

C_always, C_8eq0, C_lsb

C_gbstall2, C_lt0, C_gt0.

The way to specify simultaneous testing requires that the corresponding bits be set appropriately. For example, C_neq0 is also defined. This is the or'ing of bits for C_lt0 and C_gt0.

Description: Some examples of BRACIND use are:

Checking for status of GB. If GB is not ready call stall handler routine.

Returning from a subroutine call (see routine in line above).

Precomputing a destination address and using this to control the program flow.

READ_GB_K(WB,K1,K2)

Cycles: 4 cycles, depending upon K1 value. K1 value of G_hwmot will cause results not to be available until up to 8 cycles later.

Function: Send value of K1 and K2 to the GB engine 18.

READ_GB_R(0,K1,RI2)

Cycles: 4–8 cycles depending on value of K1

All programmer-controlled configuration and control of the GB engine 18 is done by means of the CPU 16 writing a 16-bit control word directly to the GB engine 18. It uses this value to:

Set the GB 18 operating mode

Cause a new symbol to be processed

The GB engine 18 results are accessed by the CPU 16 through the virtual registers. Types of data that are accessible in this way include:

symbol buffer contents (16 bits) in virtual register symbol 36 number of leading zeros/ones in virtual register nzero (not shown in FIG. 2)

GetBits Command Arguments

As mentioned previously, the GB engine 18 is controlled using two instructions, READ_GB_K and READ_GB_R. All GetBits activity is controlled by a constant as the first argument plus a secondary argument of a type as needed. The table below lists commands.

TABLE XII

GetBits Commands

| Assembler symbolic reference (K1 value) | K2 or R12 Value | Meaning |
|---|---|---|
| G_dct | 0 | DCT operations |
| G_revsym | len | Advance input bitstream len bits, return the next 16 bits with bits reversed in virtual register symbol, and the count of leading ones or zeros in the virtual register nzero |
| G_getsym | len | Advance input bitstream len bits, return the next 16 bits in virtual register symbol and the count of leading ones or zeros in the virtual register nzero |
| G_align | mask | Align input and/or output bitstreams on byte boundary. The mask value specifies whether input or output or both bitstreams are aligned. Alignment of input bitstream may cause values to be reread. Alignment of output bitstream may cause truncation. |
| G_setopt | see G_setopt details | Set GB options |
| G_splice | num | Splice num bits of data into the output bitstream |
| G_hwacc | see G_hwacc details | Use specified hardware accelerated table for interpreting current symbol value |
| G_adv2 | unused | Shift the input stream by the length computed in the previous G_hwacc G_hwmot, G_hwlum, or G_hwchr function. |
| G_write | 0 . . . 15 | Read or Set I/O channel information |

G_write

The G_write sets and reads the configuration of the GB engine 18 as to what Data Streamer buffers (FIG. 1) are affected by the input and output requests and the current state of the input and output processing.

When a value of '1' is supplied as the second operation (K2 or RI2 value), the Data Streamer buffer configuration information is written to the GB engine 18. When a value of '0' is supplied as the second operation, the current configuration of the GB engine 18 for this information is returned in the symbol register 36.

The value to write is taken from the decoded RI1 value of the instruction subsequent to the READ_GB_x in the VLx instruction stream. The value is interpreted as:

bit 15—If set, do not generate output as input bitstream is shifted.

bit 14—If set, turn allow output bitstream to be written to output buffer 44.

bit 13—If set, count only what is specified in bit 12. This applies to the counting of leading ones or zeros. If clear, this specifies that the number of leading ones or zeros (depending on value of first bit in current symbol) will be counted and returned in virtual register nzero for GetBits operations that cause this counting to occur.

bit 12—If bit 13 is set, this specifies to count only leading zeros if bit 12 is clear, otherwise, count only leading ones.

bits 11:6—The DS buffer ID from which the input stream is drawn bits 5:0—The DS buffer ID to which the output stream is sent.

For example, the following example shows configuration of the input and output streams:
configuration information is at offset L_GBDATA SET_K(L_GBDATA);
read this configuration into register tmp3 READ_R(W, tmp3,acc);
1 cycle latency on RAM operation NOP(0,tmp3,tmp3);
write the configuration information
READ_GB_K(0,G_write,1); # Write value 0, read value 1
ADD_R(0,tmp3,tmp3); # Set up port for GB G_write
ADD_R(0,tmp3,tmp3); # Set up port for GB G_write
ADD_R(0,tmp3,tmp3); # Set up port for GB G_write

G_setopt

The G_setopt command configures the mode of the GB engine 18. This tells the GB engine 18 information such as whether to count 1's or 0's for the symbol processing, and whether input or output I/O is enabled. The configuration information is passed as the value of K2 or RI2.

Configuration is dependent on the setting of particular bits:
Bit 5: set to 0
Bit 4: if set to 1, force DCT processing mode
Bit 3: what to count as leading bits: 0 or 1
Bit 2: if 0, count both 0 or 1; if 1 count only what is in Bit 3
Bit 1: if 1, do not read any more of input stream into input buffer 42
Bit 0: if 1, do not generate any output to output buffer 44

For example, the following example shows configuration of GetBits READ_GB_K(0,G_setopt, 0b00101); # Write output, count 0s

G_revsym

Shift K2 or *RI2 bits from the input buffer 42. Return the next 16 bits in the input buffer 42 in bit reversed order into the virtual register symbol 36.

G_getsym

Shift K2 or*RI2 bits from the input buffer for the next symbol. Return the next 16 bits as current symbol in the symbol virtual register 36.

G_align

Align either the input bitstream or output bitstream or both on the nearest byte alignment, causing truncation on output or re-read on input if not already aligned. Splicing of padding bits prior to use of this instruction is recommended for there to be no loss in data on output.

K2 or *RI2 specified whether to align input or output or both.
Bit 1: if set, align output bitstream
Bit 0: if set, align input bitstream

G_splice

Splice in a specified number of bits from a specified value into the output bitstream. The K2 or *RI2 specifies the number of bits to be spliced into the output stream.

Splice data is provided to the GB engine 18 by the result of the instruction immediately subsequent to the READ_ GB_x. GetBits splices this data Most Significant Bit first starting at bit 15.

For example, the following example shows splicing of data into the output stream:
READ_GB_K(0,G_splice,16); # splice 16 0s
SET_K(0); # value is 0
Example 2
READ_GB_K(0,G_splice,4); # splice 4 bits from the result
ADD_K(0,sdata,0); # using an ALU op to provide the data
Example 3
READ_GB_R(0,G_splice,encsym); # splice len is low 5 bits
SHR_K(0,encsym,8); # moves length out of data

7.5.4.2.1 G_dct

This is for DCT processing of symbols. The activity performed by the GB engine 18 occurs in multiple cycles.

G_hwacc

The G_hwacc functions causes the GB engine 18 to decode the current virtual register symbol value against the specified hardware accelerated MPEG2 table and return the value of that table:

| K2 or R2 Value | Returned value in virtual register symbol 36 |
| --- | --- |
| G_hwchr | Bits 3:0 contain the length of the decoded symbol<br>Bits 15:4 contain the dct_dc_size_chrominance value in UIMSB order (bitreversed) that corresponds with the variable length code in the virtual register symbol 36 |
| G_hwlum | Bits 3:0 contain the length of the decoded symbol<br>Bits 15:4 contain the dct_dc_size_luminance value in UIMSB order (bit reversed) that corresponds with the variable length code in the virtual register symbol 36 |
| G_hwmot | Bits 7:0 contain the signed integer value motion code value for the decode variable length code in the virtual register symbol 36<br>Bits 15:8 contain the motion residual in UIMSB order (bitreversed). The motion residual length is supplied to the GB engine 18 as the result of the $3^{rd}$–$6^{th}$ instruction that follows the READ_GB_x(0,G_hwacc,G_hwmot). |
| G_nzpa | Bits 4:0 contain the results of taking the current virtual register symbol value, shifting out the number of bits specified by the virtual register nzero plus 1. Only the next 5 bits of the symbol are returned in the virtual register symbol 36. |
| G_mbi | Bits 4:0 contain the length of the decoded symbol<br>Bits 10:5 contain the macroblock_type interpreted for P-pictures using the current value of the virtual register symbol 36 as the variable length code. |
| G_mbp | Bits 4:0 contain the length of the decoded symbol<br>Bits 10:5 contain the macroblock_type interpreted for P-pictures using the current value of the virtual register symbol 36 as the variable length code. |

-continued

| K2 or R2 Value | Returned value in virtual register symbol 36 |
|---|---|
| G_mbb | Bits 4:0 contain the length of the decoded symbol<br>Bits 10:5 contain the macroblock_type interpreted for B-pictures using the current value of the virtual register symbol 36 as the variable length code. |
| G_mai | Bits 4:0 contain the length of the decoded symbol<br>Bits 10:5 contain the macroblock_address_increment using the current value of the virtual register symbol 36 as the variable length code. |
| G_cbp | Bits 4:0 contain the length of the decoded symbol<br>Bits 10:5 contain the coded_block_pattern using the current value of the virtual register symbol 36 as the variable length code. |

G_adv2

Advance the input stream by the value calculated as a result of the previous G_hwacc, G_hwmot, G_hwlum, or G_hwchr value. The next 16 bits are returned as the virtual register symbol value.

IOIF(W,RI1,K5)

Cycles: 1

Function: This command is primarily used to send issue directives to external devices and to control some of the CPU internals. (IO plus Internal interface)

Example: The IOIF instruction can be used two ways; the mode is chosen by the value of the K5 operand as follows: K5=2: perform DsContinue K5=5: perform Fastbranch operation DsContinue: For the DsContinue mode, RI1 must be a 6 bit value that indicates the DataStreamer channel ID that a DTS Continue will be sent to.

IOIF.fastbranch: Fastbranch operation allows the CPU to iterate in place using its instruction buffer only. This both eliminates calls to the RAM for instructions and provides a no-delay branch to the top of the loop. For this mode, a control value must be placed in the accumulator prior to executing the IOIF instruction. This control value defines loop size.

Example of IOIFfastbranch:

For a loop that executes 6 instructions, the code needs to be specified as follows:

NOP(0,0,0)

Cycles: 1

Function: This instruction provides a No-Op.

Example: NOP(0,0,0). (The operands can be non-zero.)

Description: No visible operation is performed.

DCT MODE

The GB engine 18 of the VLx processor 12 is capable of extremely efficient variable-length symbol parsing. This works in the following way:

Each variable length symbol is grouped in terms of the number of leading zeros or leading ones. The choice between leading zeros or ones is determined in advance and set as an option to the GB 18.

Variable Length Decode (VLD) Lookup Tables (LUTs) (not shown in FIG. 2) are then set up with one LUT per symbol group (ie. One LUT for all the symbols with zero leading zeros, one LUT for all symbols with 1 leading one, one LUT for all symbols with 2 leading ones—etc. . . . ). For MPEG video, variable-length symbols are used to represent run and level pair, which can be further processed into DCT coefficients. For MPEG2 there are 13 different group (ie 13 different LUTs) required. The VLx processor 12 maintains 13 special registers called tbase 0–12 (not shown in FIG. 2). These tbase registers are meant to be set to the addresses of the 13 different LUTs. Each tbase register must be set in the following fashion;

Bit 15=>1:0 leading 1's or 0's

0:1 or more leading 1's or 0's

Bits 14-11: log base 2 of the number of elements in the corresponding LUT

Bits 10-0: Address of the LUT in CM1

The tables themselves are setup in a special way. This is best described by example:

If we look at all the symbols with 2 leading zeros, we have:

0100s

011s

0101s

Where s is the sign bit which follows the symbol (it can be either 0 or 1 depending on the sign of the decoded DCT coefficient).

After the leading zeros, there is always a 1. This one need not be represented in the LUT since it is redundant. The GB 18 will automatically look only at the symbol past this redundant 1. Also the sign bit is not decoded via LUT but simply appended after it has been read from the table. The number of entries in the LUT is determined by looking at the longest symbol in a group. The bits between the redundant 1 and the sign bit are bit-reversed and then are used as the index into the LUT by the GB 18. In our example, the longest symbol is 0100s. There are 2 bits between the redundant 1 and the sign bit. This the LUT for symbols with 1 leading zero will have a 2-bit index (ie there will be 4 entries). In constructing the table, all symbols shorter than the longest symbol should be padded with don't care bits. In our example we then have:

0100s

011sx

0101s

Each entry in the LUT is 16 bits and encodes the run, level and symbol length, which correspond to the symbol. The run is encoded in 5 bits, the level in 6, and the length in 5 bits. The actual LUT in this case thus looks like:

LUT INDEX 0: 0000000001000101 #run=0 lev=2 len=5 #symbol=0100s

LUT INDEX 1: 0000100000100100 #run=1 lev=1 len=4 #symbol=011s

LUT INDEX 2: 0001000000100101 #run=2 lev=1 len=5 #symbol=0101s

LUT INDEX 3: 0000100000100100 #run=1 lev=1 len=4 #symbol=011s

Note that the shorter symbols (like 011) are replicated in the table due to the padding of the don't care bits.

Once all the tables are setup, the GB 18 is ready to parse the symbols. When put into DCT mode (via a READ-GB_K or BRACIND instruction) the GB 18 will look into the bitstream, determine the number of leading zeros (one ones). The GB 18 then determines which LUT to use based on the number of leading zeros. The tbase register (not shown in FIG. 2) corresponding to the chosen LUT is used to figure out the LUT address and how many bits in the symbols to use as the LUT index. The index is then extracted and bit reversed. The resulting LUT index is then used to make the lookup. The lookup result is then used to drive the run and the level registers with the correct run and level values which correspond to the symbol being decoded. The length value is used to extract the sign bit and to drive the dct sign register with the value of the sign bit. Finally the length value is used to advance the bitstream to a new symbol.

Escape codes and EOB are denoted by setting level to 0. If the GB 18 is being put into DCT mode via the BRACIND instruction, then the branch will actually take effect only when level is zero. In this way a DCT tight loop can be setup such that a branching outside the loop occurs on EOB or escape code.

From the foregoing it will be appreciated that, although specific embodiments of the invention have been described herein for purposes of illustration, various modifications may be made without deviating from the spirit and scope of the invention.

What is claimed is:

1. A variable-length encode/decode processor, comprising:
   a central processing unit;
   an instruction buffer coupled to the central processing unit;
   a getbits processing engine coupled to the central processing unit; and
   at least one shared register coupled to the central processing unit and to the getbits processing engine.

2. The processor of claim 1, further comprising thirteen shared registers coupled to the central processing unit and to the getbits processing engine.

3. The processor of claim 1, further comprising four shared registers coupled to the central processing unit and to the getbits processing engine and operable to return a state of the processor by pointing to a data location that describes the state.

4. The processor of claim 1, further comprising four shared registers coupled to the central processing unit and to the getbits processing engine and operable to return values useful for decoding an image encoded according to the MPEG2 standard.

5. The processor of claim 1, further comprising:
   an arithmetic logic unit; and
   four shared registers coupled to the central processing unit and to the getbits processing engine, a first of the four share registers also coupled to the arithmetic logic unit and operable to provide the most recent result generated by the arithmetic logic unit.

6. The processor of claim 1, further comprising four shared registers coupled to the central processing unit and to the getbits processing engine, a second of the four share registers operable to provide a testable machine state of the getbits processor.

7. The processor of claim 1, further comprising:
   a central memory register operable to store a load value; and
   four shared registers coupled to the central processing unit and to the getbits processing engine, a second of the four shared registers operable to provide one plus bits eleven to fifteen of the load value most recently stored in the central memory register.

8. The processor of claim 1, further comprising:
   a getbits input buffer; and
   four shared registers coupled to the central processing unit and to the getbits processing engine, a third of the four shared registers operable to provide the first sixteen bits of the getbits input buffer as interpreted by the getbits processor.

9. The processor of claim 1, further comprising four shared registers coupled to the central processing unit and to the getbits processing engine, a fourth of the four shared registers operable to provide to the getbits processor a count of the leading zeros or leading ones in a third of the four shared registers.

10. The processor of claim 1, wherein the getbits processing engine is operable to use the value of a writeback instruction bit to selectively control writing back to the shared register.

11. The processor of claim 1, wherein the getbits processing engine is operable to use the value of a writeback instruction bit to return the value of a program counter for an indirect conditional branch instruction.

12. The processor of claim 1, wherein the getbits processing engine is operable to modify program flow conditioned on a stall of the getbits processor.

13. The processor of claim 1, wherein the getbits processing engine is operable to parse variable-length symbols each having at least one leading bit according to the values of the leading bits.

14. A variable-length encodeldecode processor, comprising,
    a central processing unit;
    an instruction buffer coupled to the central processing unit;
    a getbits processing engine coupled to the central processing unit; and
    at least one memory unit coupled to the central processing unit and to the getbits processing engine and operable to function as an MPEG look-up table.

15. The processor of claim 14, wherein the getbits processing engine is operable to perform variable-length encoding or decoding using the look-up table.

16. The processor of claim 14, wherein the getbits processing engine is operable to perform a Discrete Cosine Transform or an Inverse Discrete Cosine Transform using the look-up table.

17. The processor of claim 14 wherein:
    the at least one memory unit is operable to function as multiple MPEG lookup tables; and
    the getbits processing engine Is operable to process a table-look-up instruction including a field that selects a particular one of the look-up tables.

18. The processor of claim 14, further comprising:
    wherein the at least one memory unit is operable to function as multiple MPEG look-up tables each having a starting address; and
    shared registers coupled to the central processing unit and to the getbits processing engine and operable to store the starting addresses of the look-up-tables.

19. The processor of claim 14, further comprising:
    a fixed-function-block processor coupled to the meadow unit; and
    wherein ths getbits processing engine is operable to obtain priority access to the memory unit by locking out the fixed-function-block processor.

* * * * *

UNITED STATES PATENT AND TRADEMARK OFFICE
CERTIFICATE OF CORRECTION

PATENT NO.    : 6,587,058 B1
DATED         : July 1, 2003
INVENTOR(S)   : Richard Deeley, Yatin Mundkur and Woobin Lee It is certified that error appears in the above-identified patent and that said Letters Patent is hereby corrected as shown below:

<u>Column 26,</u>
Line 27, please delete "encodeldecode" and insert -- encode/decode --.
Line 47, please delete "Is" and insert -- is --.
Line 58, please delete "meadow" and insert -- memory --.
Line 69, please delete "ths" and insert -- the --.

Signed and Sealed this

Twenty-fifth Day of November, 2003

JAMES E. ROGAN
*Director of the United States Patent and Trademark Office*